United States Patent [19]
Hata

[11] Patent Number: 5,745,242
[45] Date of Patent: Apr. 28, 1998

[54] POSITION DETECTING SYSTEM AND EXPOSURE APPARATUS HAVING THE SAME

[75] Inventor: Hideo Hata, Utsunomiya, Japan

[73] Assignee: Canon Kabushiki Kaisha, Tokyo, Japan

[21] Appl. No.: 547,796

[22] Filed: Oct. 25, 1995

[30] Foreign Application Priority Data

Oct. 28, 1994 [JP] Japan .................................. 6-265218

[51] Int. Cl.$^6$ .................................................. G01B 1/00
[52] U.S. Cl. ............................... 356/401; 250/559.3
[58] Field of Search .................................. 356/399–401, 356/375; 355/43, 53; 250/559.3, 548

[56] References Cited

U.S. PATENT DOCUMENTS

| | | | |
|---|---|---|---|
| 4,550,374 | 10/1985 | Meshman et al. | 356/401 |
| 5,124,562 | 6/1992 | Kawashima et al. | 356/375 |
| 5,235,408 | 8/1993 | Matsugu et al. | 356/401 |

*Primary Examiner*—K. Hantis
*Attorney, Agent, or Firm*—Fitzpatrick, Cella, Harper & Scinto

[57] ABSTRACT

A position detecting system, for detecting a position of an object, includes a light detecting device having arrayed light detecting elements, a moving mechanism for producing relative movement between the object and the light detecting device, and a control device for causing the moving mechanism to produce relative movement between the object and the light detecting dvice of a predetermined unit amount and in a predetermined position detecting direction, and also to cause the light detecting device to detect, at respective positions, light from a mark formed on the object, wherein the control device calculates mark positions from signals obtained at the respective positions, and also determines the position of the object on the basis of the calculated mark positions.

8 Claims, 9 Drawing Sheets

(A)
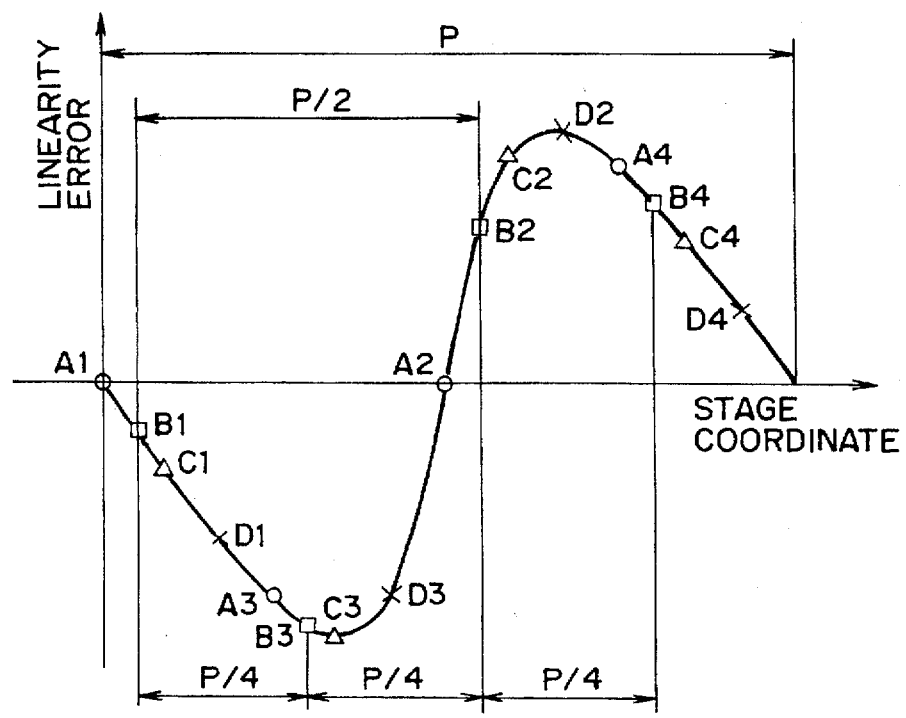
(B)
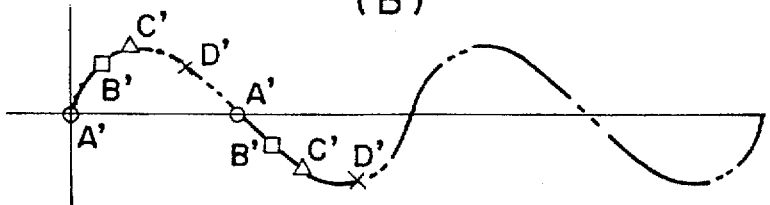
$$A' = \frac{A1+A2}{2} \text{ or } \frac{A3+A4}{2}$$
$$B' = \frac{B1+B2}{2} \text{ or } \frac{B3+B4}{2}$$
$$C' = \frac{C1+C2}{2} \text{ or } \frac{C3+C4}{2}$$
$$D' = \frac{D1+D2}{2} \text{ or } \frac{D3+D4}{2}$$
(C)
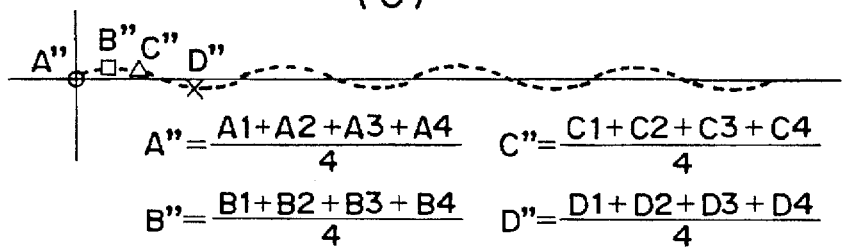
$$A'' = \frac{A1+A2+A3+A4}{4} \quad C'' = \frac{C1+C2+C3+C4}{4}$$
$$B'' = \frac{B1+B2+B3+B4}{4} \quad D'' = \frac{D1+D2+D3+D4}{4}$$
F I G. 6

POSITION DETECTING SYSTEM AND EXPOSURE APPARATUS HAVING THE SAME

FIELD OF THE INVENTION AND RELATED ART

This invention relates generally to an exposure apparatus having a measuring system, more particularly, an alignment system for aligning a reticle and a semiconductor wafer very precisely for lithographic transfer of an image of the reticle onto a pattern formed on the wafer.

Further advancements of the integration of a semiconductor integrated circuit have forced a semiconductor device manufacturing exposure apparatus to provide submicron order high resolution and corresponding high precision alignment performance.

When, in an exposure apparatus, a projected image of a reticle and a wafer are to be aligned (this is called "alignment"), usually the wafer placed on a wafer stage is moved to a position below a microscope. The microscope is used to observe an alignment mark (wafer mark) of the wafer. From a positional deviation of the wafer mark with respect to a microscope reference and from the position of the stage at that moment, the position of the wafer is detected. Then, the wafer is brought into alignment with the projected image of the reticle.

An example of the process for measuring the positional deviation of a wafer mark uses a method in which the wafer mark is illuminated and in which an optical image of the illuminated wafer mark is projected, in an enlarged scale, onto an image pickup device through an objective lens, a relay lens and an erector lens. Generally, such an image pickup device comprises an image pickup tube or a solid image pickup device. Because of coordinate precision, stability and measurement concurrency in the picture field (which are advantageous in the point of measurement precision and in the point of reliability), in many cases, a solid image pickup device called "CCD" is used. The following explanation will be made while taking a case of a CCD as an example.

The optical image of the wafer mark projected and magnified on a CCD is converted by picture elements of the CCD into electric signals which are proportional to the brightness at each picture element. The amount of positional deviation of the wafer mark can be measured by processing such an imagewise signal. Physical resolution is determined by the pitch of the picture elements of the CCD and the imaging magnification of the microscope. A standard picture element number of a CCD is about 500×500. A picture field size necessary for the measurement is about 100–200 micron square. As a result, the physical resolution is about 0.2–0.4 micron. Actually, discrete data from the CCD picture elements corresponding to the optical image of the wafer mark are processed in accordance with any of conventional image processing methods such as:

(a) analogizing a waveform from selected data, and measuring its peak position;

(b) calculating the area from the waveform shape and calculating the gravity center position of that shape; and (c) calculating the central position of the waveform where the symmetry of left hand and right hand slopes is highest.

As a result of such image processing, a measurement resolution of about 1/5–1/10 of the physical resolution is obtainable.

On an occasion when the picture element pitch of the CCD for a particular optical signal waveform of a wafer mark is sufficiently small and thus, there are a sufficient number of measurement points defined, the same measurement result will be provided regardless of the positions of the picture elements of the CCD with respect to the optical signal waveform. In order to assure this, the microscope should have a high imaging magnification or a CCD of high resolution should be used. However, the use of an enlarged imaging magnification results in a decrease of detected light quantity which may cause a disadvantage of degraded signal-to-noise ratio, leading to a detection error. Using a CCD of high resolution raises a disadvantage of increased cost of the system and, practically, it is not easy to do so.

In practical wafer mark signal detection by using a practical measuring system such as described above, there are cases in which the measured value changes with the picture element position of the CCD due to the relative insufficiency of the number of measuring points. Namely, in such a case, the measurement linearity is not good because of insufficient measurement resolution.

SUMMARY OF THE INVENTION

It is an object of the present invention to provide at least one of a position measuring system, an alignment system, an exposure apparatus and a device manufacturing method, in any of which linearity error can be reduced with a smaller number of measurement times.

In accordance with an aspect of the present invention, there is provided a position detecting system for detecting the position of an object, said system comprising: light detecting means having arrayed light detecting elements; moving means for producing relative movement between the object and said light detecting means; and control means serviceable to cause said moving means to produce relative movement between the object and said light detecting means of a predetermined unit amount and in a predetermined position detecting direction, and also to cause said light detecting means to detect, at respective positions, light from a mark formed on the object, said control means further being serviceable to calculate mark positions from signals obtained at said respective positions, and also to determine the position of the object on the basis of the calculated mark positions.

In one preferred form of this aspect of the present invention, the system further comprises movement amount detecting means for detecting the amount of relative movement between the object and the light detecting means, wherein the relative movement between the object and said light detecting means of said predetermined unit amount and in said predetermined position detecting direction is made on the basis of the detection by said movement amount detecting means.

In another preferred form of this aspect of the present invention, when said light detecting elements are arrayed with a pitch P, the number of the positions whereat the mark position is to be detected is M, and said predetermined unit amount on said light detecting means is D, a relation D=P×N+P/M is satisfied, where N is an integer.

In a further preferred form of this aspect of the present invention, said moving means moves the object to a predetermined position on the basis of the determined mark position.

In accordance with another aspect of the present invention, there is provided a position detecting method for detecting the position of an object, said method comprising the steps of: relatively moving the object and light detecting means having arrayed light detecting elements with a predetermined unit amount and in a predetermined position detecting direction; detecting, at respective positions and through the light detecting means, light from a mark formed on the object; calculating mark positions from signals obtained at said respective positions; and determining the position of the object on the basis of the calculated mark positions.

In one preferred form of this aspect of the present invention, said moving step includes detecting the amount of relative movement between the object and the light detecting means, wherein the relative movement between the object and the light detecting means of said predetermined unit amount and in said predetermined position detecting direction is made on the basis of said movement amount detection.

In another preferred form of this aspect of the present invention, when the light detecting elements are arrayed with a pitch P, the number of the positions whereat the mark position is to be detected is M, and said predetermined unit amount on the light detecting means is D, a relation D=P× N+P/M is satisfied, where N is an integer.

In a further preferred form of this aspect of the present invention, the object is moved to a predetermined position on the basis of the determined mark position.

In accordance with a further aspect of the present invention, there is provided an apparatus for printing a circuit pattern of a mask onto a wafer coated with a photosensitive material, said apparatus comprising: light detecting means having arrayed light detecting elements; moving means for producing relative movement between the wafer and said light detecting means; and control means serviceable to cause said moving means to produce relative movement between the wafer and said light detecting means of a predetermined unit amount and in a predetermined position detecting direction, and also to cause said light detecting means to detect, at respective positions, light from a mark formed on the wafer, said control means further being serviceable to calculate mark positions from signals obtained at said respective positions, and also to determine the position of the wafer on the basis of the calculated mark positions.

In accordance with a still further aspect of the present invention, there is provided a device manufacturing method including a step for printing a circuit pattern of a mask onto a wafer coated with a photosensitive material, said method comprising the steps of: relatively moving the wafer and light detecting means having arrayed light detecting elements with a predetermined unit amount and in a predetermined position detecting direction; detecting, at respective positions and through the light detecting means, light from a mark formed on the wafer; calculating mark positions from signals obtained at said respective positions; and determining the position of the wafer on the basis of the calculated mark positions.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6(A) through 6(C) are schematic view of a portion of FIG. 5, illustrated in a magnified scale and corresponding to one picture element with the linear component removed, and show the relation between the stage coordinate position and the linearity error of an average value of the wafer mark measurement.

DESCRIPTION OF THE PREFERRED EMBODIMENTS

Now, preferred embodiments of the present invention will be explained with reference to the drawings.

First Embodiment

Figure 1:
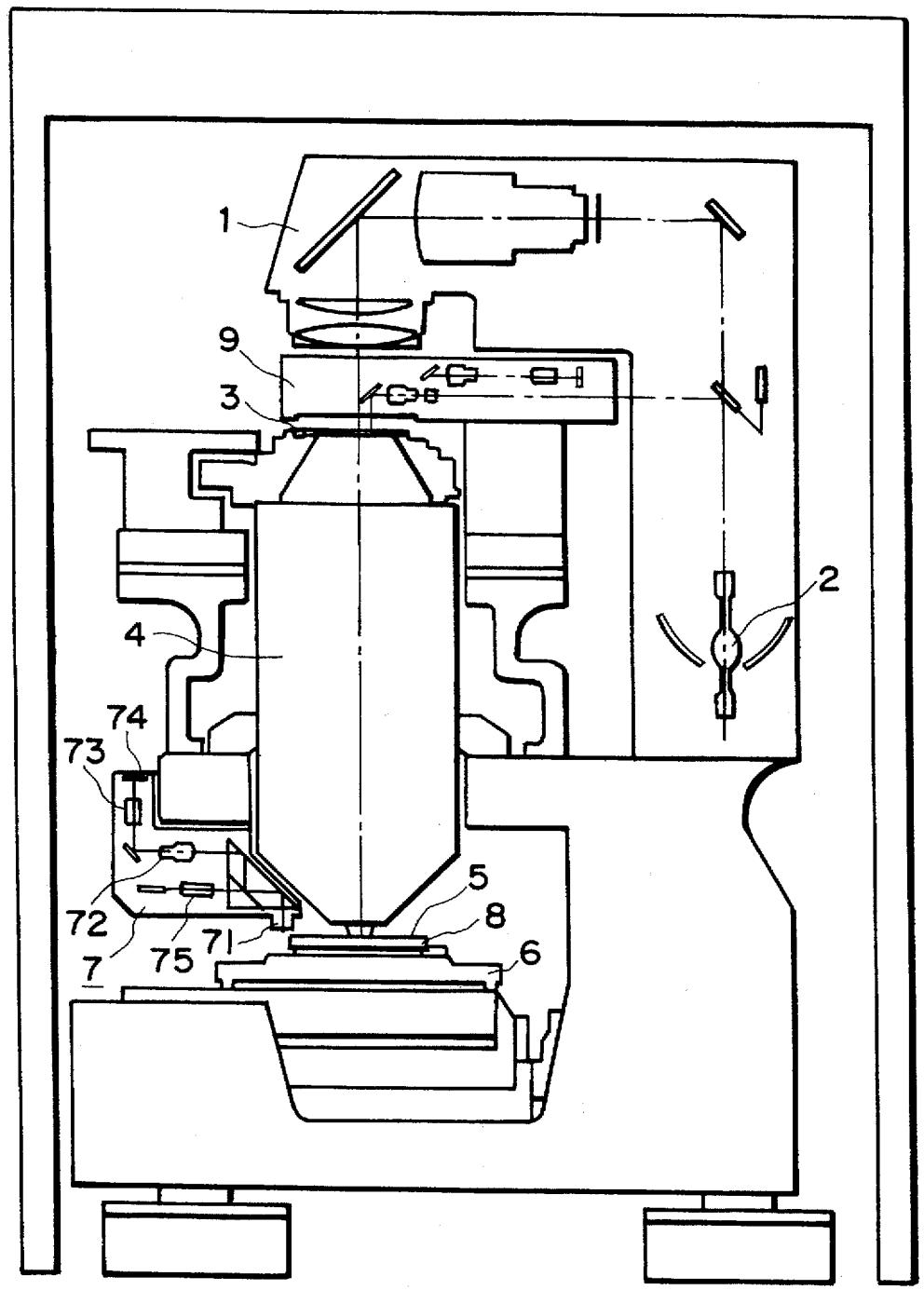
FIG. 1 is a schematic view of an exposure apparatus into which an alignment system according to the present invention is suitably incorporated.
Figure 2:
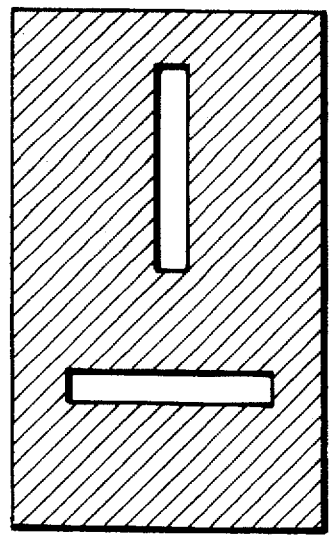
FIG. 2 is an enlarged view of an alignment mark formed on a wafer.

FIG. 1 is a schematic view of an exposure apparatus into which an alignment system according to the present invention is suitably incorporated. FIG. 2 shows an alignment mark (wafer mark) formed on a wafer.

The exposure apparatus of this embodiment comprises, as shown in FIG. 1, an illumination system 1 having a Hg lamp (light source) 2 for illuminating a reticle 3, and a projection lens 4 for projecting an image of the reticle onto a wafer 5. The exposure apparatus further comprises a position measuring system and an alignment system which include at least a movable wafer stage 6 having a wafer chuck 8 for holding the wafer 5 through attraction, an off-axis microscope 7 for measuring the position of the wafer mark with respect to a microscope reference, for calculation of the amount of positional deviation of the wafer mark, a laser interferometer (not shown) for detecting the position of the wafer stage 6, and operation and control means (not shown) for controlling these components. The wafer is provided with wafer marks, one of which is shown in FIG. 2.

The wafer 5 having a coating of photosensitive material is moved by an unshown wafer conveying system onto the wafer chuck 8. The wafer 5 as held by the wafer chuck 8 through attraction is then moved by the wafer stage 6 so that a wafer mark comes into the observation view field of the off-axis microscope 7. Then, while moving the wafer stage 6 stepwise, plural wafer marks on the wafer 5 are measured through the off-axis microscope 7. From the coordinates of the wafer stage 6 at the moments as the respective wafer marks are measured and from the amount of positional deviation of each wafer mark with respect to the microscope reference, the position to which the wafer is to be moved is determined in a statistical manner. With a predetermined amount based on this, the wafer stage 6 is driven and the alignment of the projected image of the reticle 3 and the wafer pattern is performed.

The off-axis microscope 7 comprises an objective lens 71, a relay lens 72, an erector lens 73, a CCD (solid image pickup device) 74 and a perpendicular illumination system 75. A wafer mark of the wafer to be examined, being illuminated by the illumination system 75, is imaged through the objective lens 71, the relay lens 72 and the erector lens 73 upon the CCD 74.

Figure 3:
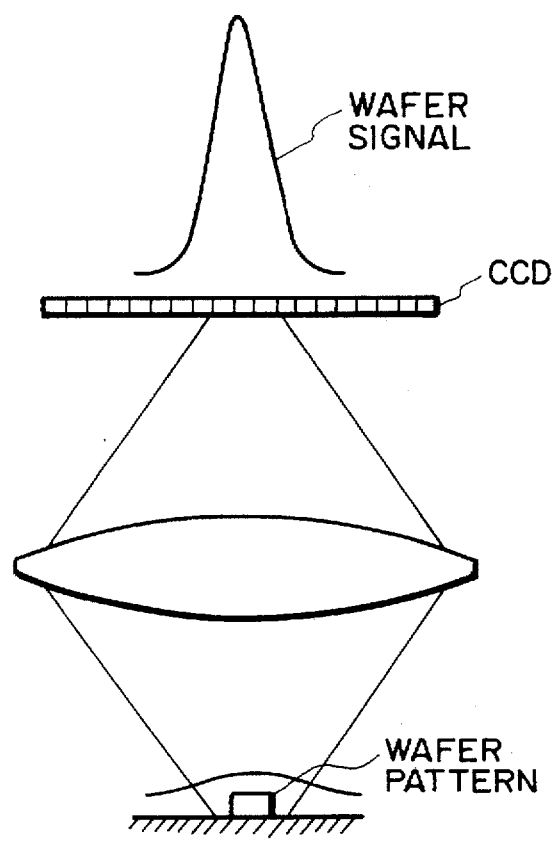
FIG. 3 is a schematic view for explaining the relation between an optical image of a wafer mark and a CCD.
Figure 4A:
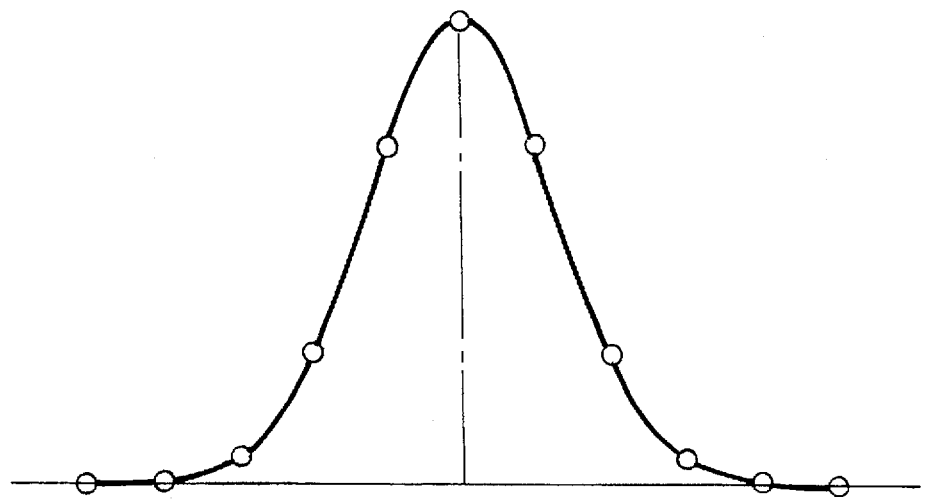
FIGS. 4A and 4B are schematic views, respectively, for explaining the relation between an optical signal waveform of a wafer mark and a CCD.
Figure 4B:
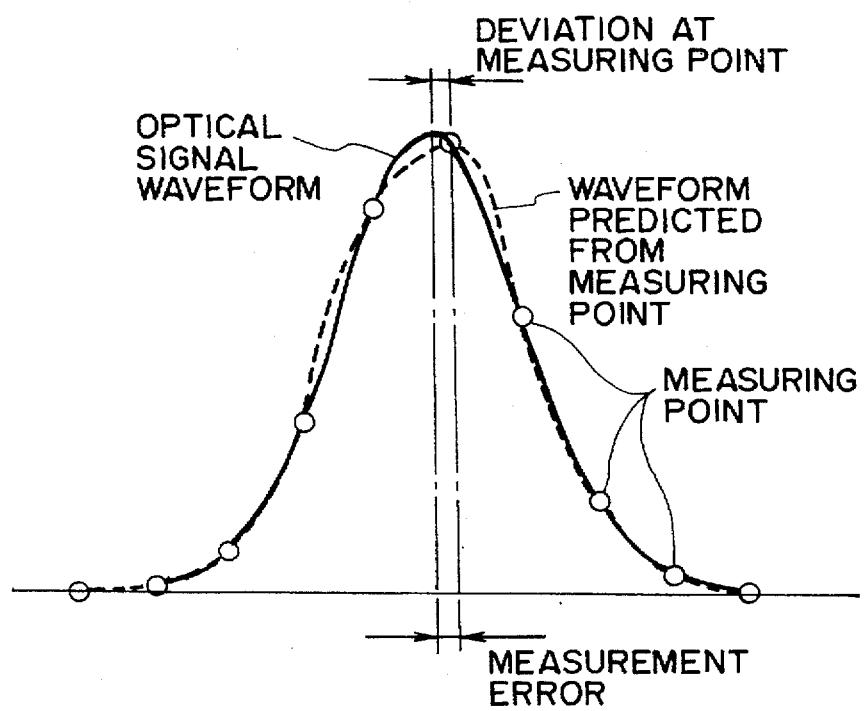

FIG. 3 is a schematic view for explaining the relation between an optical image of a wafer mark and the CCD. FIGS. 4A and 4B are related enlarged views, illustrating the relation between an optical signal waveform of the wafer mark and the CCD.

On an occasion when the picture elements of the CCD are disposed symmetrically relative to the optical signal waveform having symmetry, such as shown in FIG. 4A, the signal waveform as analogized from measured values of the CCD approximates the optical signal waveform and, therefore, no measurement error occurs. However, if the picture elements of the CCD are not disposed symmetrically relative to the optical signal waveform such as shown in FIG. 4B, the signal waveform as analogized from the measured values of the CCD differs from the optical waveform, and there occurs a measurement error.

Figure 5:
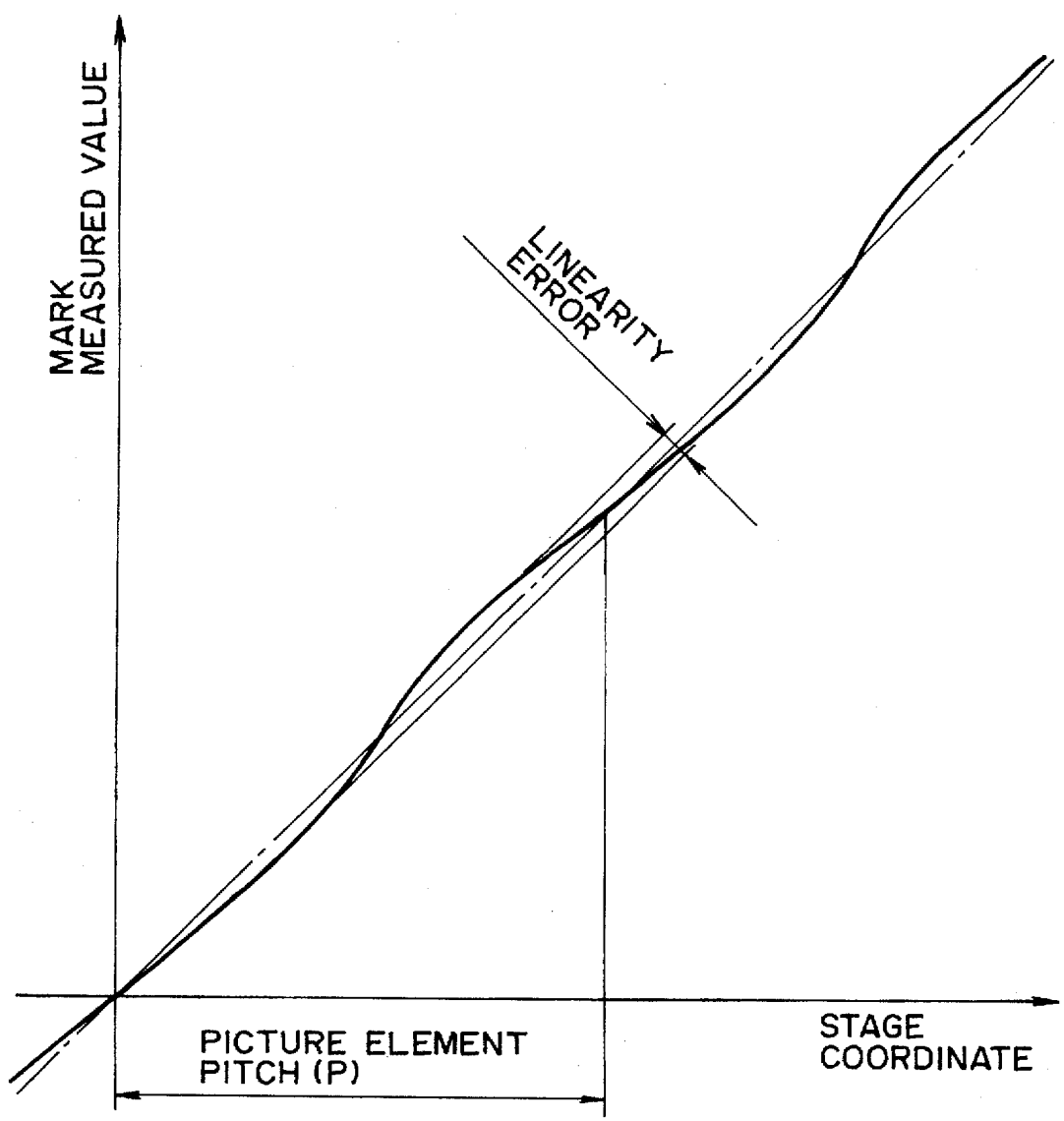
FIG. 5 is a graph for explaining the relation between the wafer mark movement amount and the wafer mark measured value as a wafer mark is moved by a wafer stage.

FIG. 5 illustrates the relation between the mark movement amount and the wafer mark measured value as a wafer mark is moved by the wafer stage.

If there is no measurement error, measured values are on a straight line. Actually, however, because of a measurement error caused as described, the measured values change at the period of the picture element pitch. This is called "linearity error" in the Specification. FIG. 6(A), shows a portion of FIG. 5 in an enlarged scale, corresponding to one picture element, with the linear component being removed. If there is a linearity error such as shown in FIG. 6 6(A), for the first time measurement, wafer mark measurement is made at an arbitrary position on the stage. For the second time measurement, the wafer mark measurement is made while moving the wafer stepwise by an amount corresponding to ½ of the picture element pitch (stage driving amount upon the CCD). Then, an average of the first and second time wafer mark measured values is calculated. FIG. 6 6(B), shows the relation between the linearity error of the average of wafer mark measurements and the stage coordinate position at that time (for example, an average of the stage coordinate position at the first time wafer mark measurement and the stage coordinate position at the second time wafer mark measurement). FIG. 6(C) 6 shows the relation between the stage coordinate position and the linearity error of the average of the wafer mark measurements, on an occasion when: the amount of stepwise motion of the wafer is set to be equal to ¼ of the picture element pitch; wafer mark measurements are made at respective positions; this operation is repeated a total of four times; and an average of the four wafer mark measurements is calculated.

Statistically stating, when measured values at two or four random points are averaged, as compared with the data based on a single point, the peak value of the linearity error reduces to $1/\sqrt{2}$ or $1/\sqrt{4}=\frac{1}{2}$. In accordance with the method of the present invention, such as that of FIG. 6, when an average of measurements at two points is used, the measurement error is efficiently reduced to about ⅓ and, when an average of measurements at four points is used, it is efficiently reduced to about 1/10.

When the picture element pitch is denoted by P and the number of average measurement times is M, the driving amount of the stage as upon the CCD is set to be equal to P/M in the embodiment as described. However, substantially the same advantageous result is attainable, as a matter of course, when the driving amount of the stage as upon the CCD is set to be equal to the result of adding P/M to the product of multiplying the picture element pitch by an integer, that is, P×N+P/M (N is an integer).

While this embodiment has been described with reference to the combination of an off-axis microscope and a wafer mark, the method of the present invention is applicable also to cases where a reticle mark or a reference mark is taken as an image through a TTL microscope or a reticle microscope and the position of the mark is measured.

Further, although in the present embodiment the measurement is made while moving the mark, a similar advantageous result is attainable by relatively changing the relation between the mark image and the picture elements, such as by moving the microscope while holding the mark stationary.

Second Embodiment

Here, a description will be made regarding a method of base line measurement in an exposure apparatus, in accordance with an embodiment of the present invention.

The base line is the distance from the projection optical axis to the microscope reference. Usually, in the process of aligning a wafer with respect to a projected image of a reticle, a wafer mark is measured with respect to the microscope reference, and the wafer mark is moved to a position below the lens by an amount corresponding to the sum of the detected deviation plus the base line having been measured beforehand. If the base line measurement contains an error, a shift corresponding to such a measurement error is added to every zone of the wafer. For this reason, the base line measurement precision should be high as compared with the wafer measurement precision. Even if it needs a little bit longer time, the base line must be measured very accurately.

In FIG. 1, a wafer mark on the wafer 5 is moved to a position below the projection lens 4, and positional deviation $D_{ttl}$ between the wafer mark of the wafer 5 and a reticle mark of the reticle 3 is measured by using the TTL microscope 9. Concurrently, the position $P_{ttl}$ of the wafer stage 6 is measured. Subsequently, the wafer stage 6 is moved so that the same wafer mark is placed below the off-axis microscope, and wafer mark positional deviation $D_{oa}$ with respect to the off-axis microscope reference is measured. Concurrently, the stage position $P_{oa}$ is measured. Here, the base line measured value $L_{base}$ is determined by:

$$L_{base} = (P_{ttl} - D_{ttl}) - (P_{oa} - D_{oa})$$

After this, the wafer is moved again to the position below the projection lens, and deviation between the reticle and the wafer is measured by using the TTL microscope. However, the stage position at this time is modified with a shift S1 relative to the stage position having been measured at the preceding measurement. Here, the shift quantity S1 is:

$$S1 = P1/M$$

where P1 is the picture element resolution of the TTL microscope and M is the number of measurement repetitions. Subsequently, the wafer is moved to the position below the off-axis microscope, and positional deviation of the wafer mark with respect to the off-axis microscope reference is measured. However, the stage position at this time is modified with a shift S2 relative to the stage position having been measured at the preceding measurement. The shift quantity S2 is:

$$S2=P2/M$$

where P2 is the picture element resolution of the off-axis microscope. Then, the base line measurement is carried out.

The above-described process is repeated, and an average of the base line measured values is taken as the base line length.

With the method described above, accurate base line measurement is assured. Thus, by aligning a wafer and a reticle on the basis of the detected base line and by performing a lithographic process, the pattern of the reticle can be transferred onto the wafer correctly.

Third Embodiment

A measurement method of the present invention will now be explained with reference to an alignment deviation measuring system in which positional deviation is detected while providing a resist pattern on a wafer.

Figure 7A:
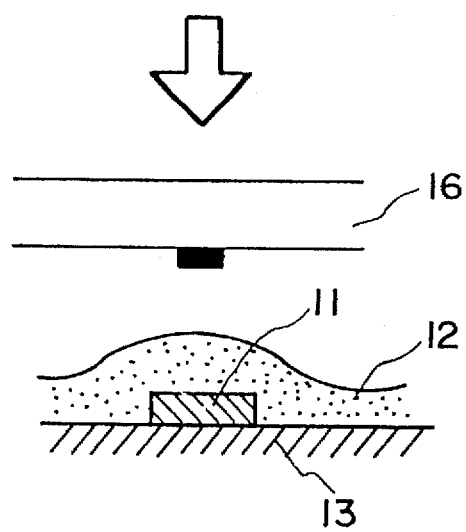
FIGS. 7A, 7B and 7C are schematic views, respectively, for explaining how a resist pattern is formed on a measurement reference pattern (wafer pattern) on a wafer.
Figure 7B:
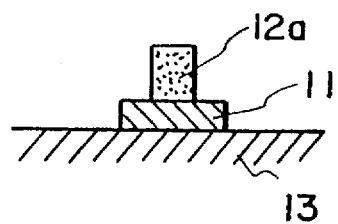
Figure 7C:
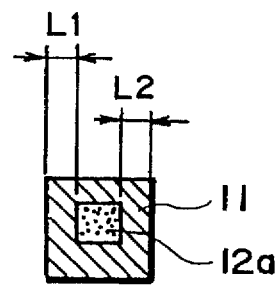
Figure 8:
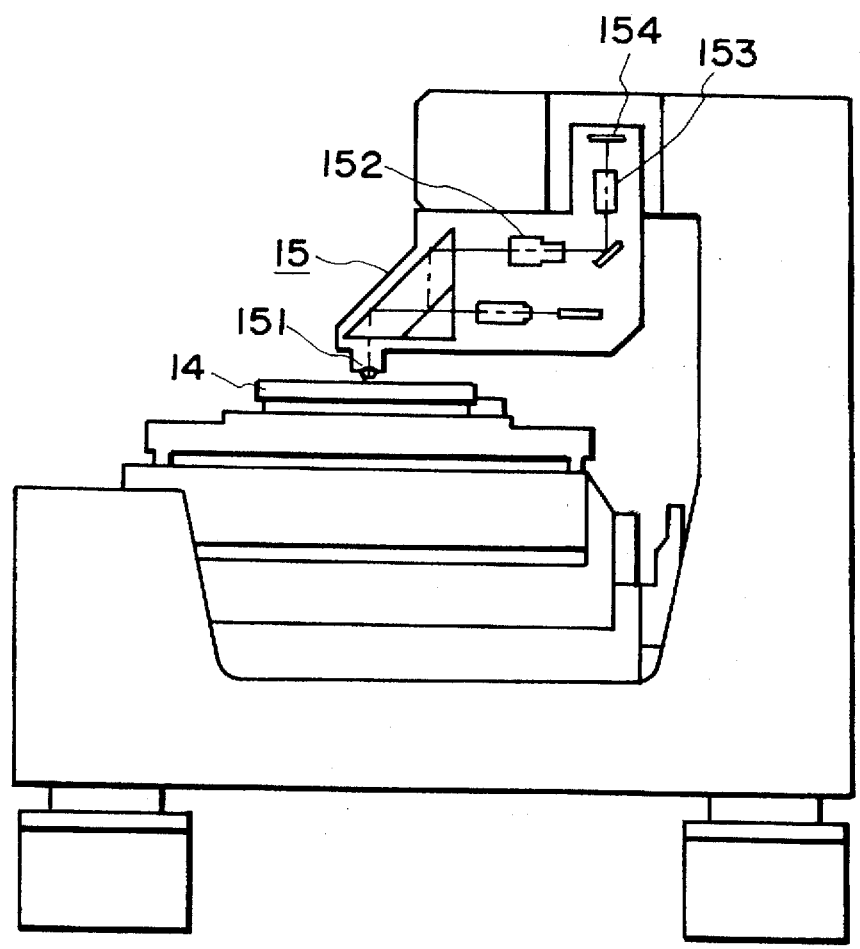
FIG. 8 is a schematic view of an alignment error measuring system.

FIGS. 7A, 7B and 7C are schematic views, respectively, for explaining how a resist pattern is formed on a measurement reference pattern (wafer pattern) of a wafer. FIG. 8 is a schematic view of an example of an alignment deviation measuring system.

As shown in FIG. 7A, a wafer 13 has a measurement reference pattern 11 formed beforehand and the wafer is coated with a resist 12. Onto this wafer, a reticle image of a mask 16 is projected and transferred by an exposure apparatus, while being aligned with respect to the measurement reference pattern 11 of the wafer 13. Then, with a developing process of the wafer, a resist pattern 12a is defined on the measurement reference pattern 11 of the wafer, such as shown in FIG. 7B.

The wafer 13, having its resist pattern 12a formed as described, is moved onto a wafer stage 14 of the alignment deviation measuring system of FIG. 8, and the measurement pattern region of the wafer is moved by a wafer stage 14 to a position below of a microscope 15. The measurement reference pattern 11 and the resist pattern 12a shown in FIG. 7B are projected, in an enlarged scale, onto a CCD 154 by an objective lens, a relay lens 152 and an erector lens 153 of the microscope 15.

Subsequently, positions of edges are measured in accordance with image processing. Then, while taking the distance from a first edge position of the measurement reference pattern to a first edge position of the resist pattern as L1 (FIG. 7C) and taking the distance from a second edge position of the resist pattern to a second edge position of the measurement reference pattern as L2, (L1–L2)/2 is calculated. By this, alignment deviation of the resist pattern with respect to the measurement reference pattern (wafer pattern) is detected.

Here, if the picture element resolution is insufficient, the stage may be driven to incrementally shift the pattern position relative to the picture element position. Measurement may be made at different positions, and an average of measured values may be calculated. The stage drive amount Wp in such a case may be:

$$Wp=P\times N\pm P/M$$

where M is the average measurement times and P is the picture element resolution. By doing so, alignment deviation can be measured precisely with a smaller number of average times.

Fourth Embodiment

In the first to third embodiments described hereinbefore, measurement for improvement of linearity error is performed with regard to each wafer mark. However, substantially the same advantageous result is attainable if plural wafer marks are used. More specifically, when the number of marks is M (M is a multiple of 2) and the picture element pitch as converted into the mark position is P, a mark with enhanced linearity improvement effect is attainable by the wafer mark pitch of P×N+P/M (N is an integer).

If, to the contrary, the pitch of the wafer mark should be fixed, substantially the same advantageous result is obtainable by determining the imaging magnification so that the above-described relation is satisfied.

Fifth Embodiment

Now, an embodiment of a device manufacturing method, based on an exposure apparatus into which an alignment system according to the present invention is suitably incorporated, will be explained.

Figure 9:
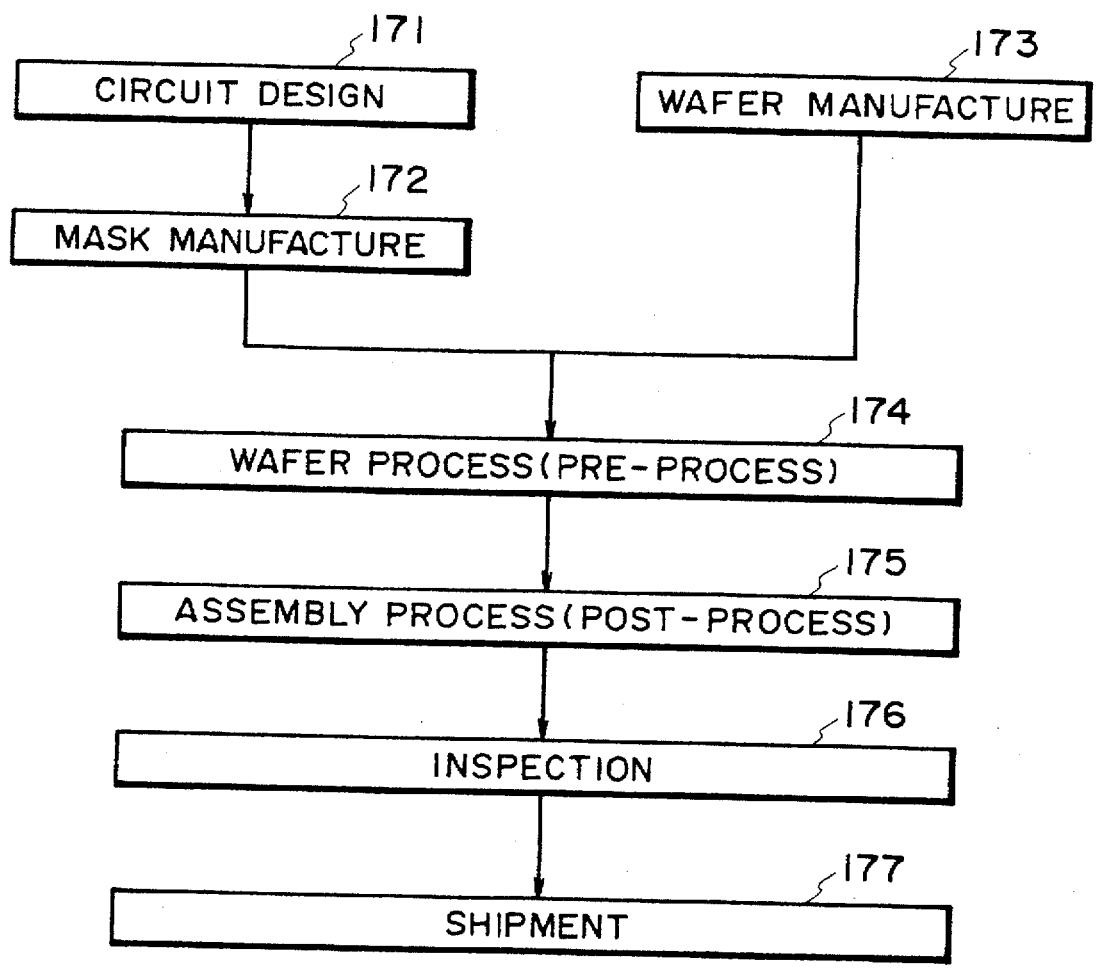
FIG. 9 is a flow chart of microdevice manufacturing processes.

FIG. 9 is a flow chart of the sequence of manufacturing a semiconductor device such as a semiconductor chip (e.g., an IC or an LSI), a liquid crystal panel or a CCD, for example. Step 171 is a design process for designing the circuit of a semiconductor device. Step 172 is a process for manufacturing a mask on the basis of the circuit pattern design. Step 173 is a process for manufacturing a wafer by using a material such as silicon.

Step 174 is a wafer process which is called a pre-process wherein, by using the so prepared mask and wafer, circuits are practically formed on the wafer through lithography. Step 175 subsequent to this is an assembling step which is called a post-process wherein the wafer processed by step 174 is formed into semiconductor chips. This step includes assembling (dicing and bonding) and packaging (chip sealing). Step 176 is an inspection step wherein an operability check, a durability check and so on of the semiconductor devices produced by step 175 are carried out. With these processes, semiconductor devices are finished and they are shipped (step 177).

Figure 10:
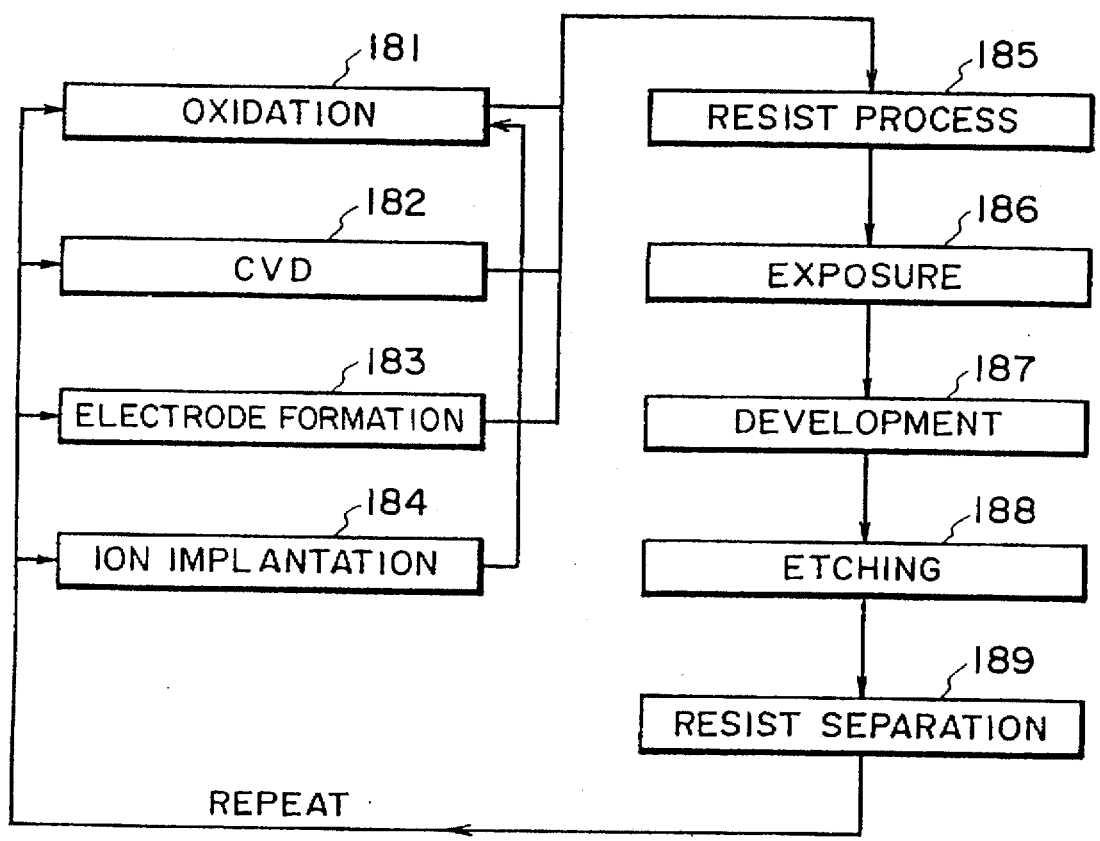
FIG. 10 is a flow chart of a wafer process included in the flow chart of FIG. 9.

FIG. 10 is a flow chart showing details of the wafer process. Step 181 is an oxidation process for oxidizing the surface of a wafer. Step 182 is a CVD process for forming an insulating film on the wafer surface. Step 183 is an electrode forming process for forming electrodes on the wafer by vapor deposition. Step 184 is an ion implanting process for implanting ions to the wafer. Step 185 is a resist process for applying a resist (photosensitive material) to the wafer. Step 186 is an exposure process for printing, by exposure, the circuit pattern of the mask on the wafer through the exposure apparatus described above. Step 187 is a developing process for developing the exposed wafer. Step 188 is an etching process for removing portions other than the developed resist image. Step 189 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system for detecting a position of an object, said system comprising:

light detecting means having arrayed light detecting elements;

moving means for moving the object relative to said light detecting means, along a predetermined coordinate system; and control means for causing said moving means to move the object incrementally, and causing said light detecting means to detect, at respective incremental positions, an image of a mark provided on the object, said control means calculating, at the respective incremental positions, a position of the image of the mark upon said light detecting means and determining the position of the mark with respect to the coordinate system on the basis of an average of the calculated positions of the images of the mark, wherein, when said light detecting elements are arrayed with a pitch P, the number of averaging times is M, and the amount of incremental movement on said light detecting means is D, a relation $D = P \times N + P/M$ is satisfied, where N is an integer.

2. A system according to claim 1, further comprising movement amount detecting means for detecting the amount of relative movement between the object and said light detecting means, wherein the relative movement between the object and said light detecting means of the incremental amount is made on the basis of the detection by said movement amount detecting means.

3. A system according to claim 1, wherein said moving means moves the object to a predetermined position on the basis of a determined mark position.

4. A position detecting method for detecting a position of an object, said method comprising the steps of:

relatively moving the object and light detecting means, having arrayed light detecting elements, along a predetermined coordinate system;

causing the object to move incrementally;

causing the light detecting means to detect, at respective incremental positions, an image of a mark provided on the object;

calculating, at the respective incremental positions, a position of the image of the mark upon the light detecting means; and determining the position of the mark with respect to the coordinate system on the basis of an average of the calculated positions of the images of the mark, wherein, when said light detecting elements are arrayed with a pitch P, the number of averaging times is M, and the amount of incremental movement on said light detecting means is D, a relation $D = P \times N + P/M$ is satisfied, where N is an integer.

5. A method according to claim 4, further comprising detecting the amount of relative movement between the object and the light detecting means, wherein the relative movement between the object and the light detecting means of the incremental amount is made on the basis of the movement amount detection.

6. A method according to claim 4, further comprising moving the object to a predetermined position on the basis of a determined mark position.

7. An apparatus for printing a circuit pattern of a mask onto a wafer coated with a photosensitive material, said apparatus comprising:

light detecting means having arrayed light detecting elements;

moving means for moving the wafer relative to said light detecting means, along a predetermined coordinate system; and control means for causing said moving means to move the wafer incrementally, and causing said light detecting means to detect, at respective incremental positions, an image of a mark provided on the wafer, said control means calculating, at the respective incremental positions, a position of the image of the mark upon said light detecting means and determining the position of the mark with respect to the coordinate system on the basis of an average of the calculated positions of the images of the mark, wherein, when said light detecting elements are arrayed with a pitch P, the number of averaging times is M, and the amount of incremental movement on said light detecting means is D, a relation $D = P \times N + P/M$ is satisfied, where N is an integer.

8. A device manufacturing method including a step for printing a circuit pattern of a mask onto a wafer coated with a photosensitive material, said method comprising the steps of:

relatively moving the wafer and light detecting means, having arrayed light detecting elements, along a predetermined coordinate system;

causing the wafer to move incrementally;

causing the light detecting means to detect, at respective incremental positions, an image of a mark provided on the wafer;

calculating, at the respective incremental positions, a position of the image of the mark upon the light detecting means; and determining the position of the mark with respect to the coordinate system on the basis of an average of the calculated positions of the images of the mark, wherein, when said light detecting elements are arrayed with a pitch P, the number of averaging times is M, and the amount of incremental movement on said light detecting means is D, a relation $D = P \times N + P/M$ is satisfied, where N is an integer.

* * * * *

UNITED STATES PATENT AND TRADEMARK OFFICE
CERTIFICATE OF CORRECTION

PATENT NO. : 5,745,242

DATED : April 28, 1998

INVENTOR(S): HIDEO HATA

It is certified that error appears in the above-identified patent and that said Letters Patent is hereby corrected as shown below:

ON THE COVER PAGE

At item [57], in the "ABSTRACT":
    line 7, change "dvice" to --device--.

IN THE DRAWINGS

Replace Sheet 5, "Figure 6", with Figs. 6(A) through 6(C) as shown on the next sheet.

COLUMN 1 line 38, "called" should read --called a--.

COLUMN 4 line 11, "view" should read --views--; and
    line 63, "as" should read --at which--.

UNITED STATES PATENT AND TRADEMARK OFFICE
CERTIFICATE OF CORRECTION

PATENT NO. : 5,745,242

DATED : April 28, 1998

INVENTOR(S) : HIDEO HATA

Page 2 of 3

It is certified that error appears in the above-identified patent and that said Letters Patent is hereby corrected as shown below:

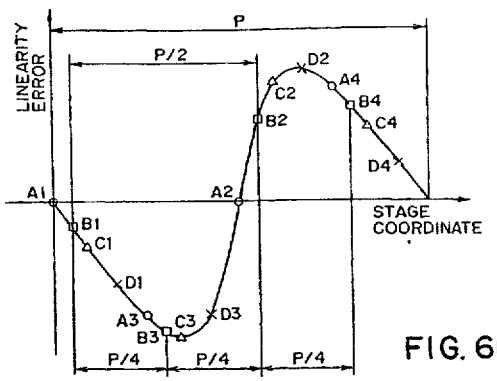

FIG. 6(A)

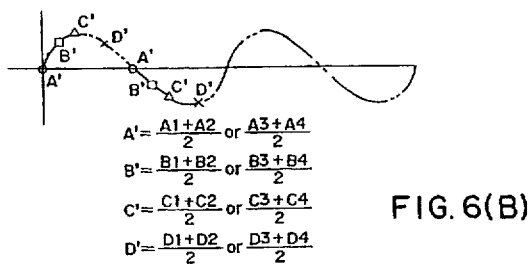

$$A' = \frac{A1+A2}{2} \text{ or } \frac{A3+A4}{2}$$
$$B' = \frac{B1+B2}{2} \text{ or } \frac{B3+B4}{2}$$
$$C' = \frac{C1+C2}{2} \text{ or } \frac{C3+C4}{2}$$
$$D' = \frac{D1+D2}{2} \text{ or } \frac{D3+D4}{2}$$

FIG. 6(B)

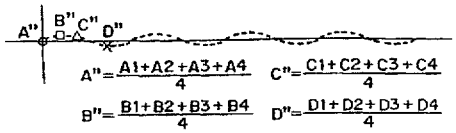

$$A'' = \frac{A1+A2+A3+A4}{4} \quad C'' = \frac{C1+C2+C3+C4}{4}$$
$$B'' = \frac{B1+B2+B3+B4}{4} \quad D'' = \frac{D1+D2+D3+D4}{4}$$

FIG. 6(C)

UNITED STATES PATENT AND TRADEMARK OFFICE
CERTIFICATE OF CORRECTION

PATENT NO. : 5,745,242

DATED : April 28, 1998

INVENTOR(S): HIDEO HATA

It is certified that error appears in the above-identified patent and that said Letters Patent is hereby corrected as shown below:

COLUMN 5

```
    line 37, "FIG. 6 6(A)," should read --FIG. 6(A)--;
    line 44, "FIG. 6 6(B)," should read --FIG. 6(B)--;
    line 50, "FIG. 6(C)6" should read --FIG. 6(C)--; and
    line 63, "FIG. 6" should read --FIGS. 6(A) through
6(C)--.
```

COLUMN 6

```
    line 3, "as upon" should read --as indicated upon--;
and
    line 6, "as upon" should read --as indicated upon--.
```

COLUMN 7

```
    line 41, "of" should be deleted.
```

Signed and Sealed this

Ninth Day of February, 1999

Attest:

*Acting Commissioner of Patents and Trademarks*

*Attesting Officer*